(12) United States Patent
Norouzpourshirazi et al.

(10) Patent No.: US 12,113,551 B2
(45) Date of Patent: Oct. 8, 2024

(54) CALIBRATION OF ANTI-ALIASING FILTER MISMATCH

(71) Applicant: Cirrus Logic International Semiconductor Ltd., Edinburgh (GB)

(72) Inventors: Arashk Norouzpourshirazi, Austin, TX (US); John L. Melanson, Austin, TX (US); Axel Thomsen, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 257 days.

(21) Appl. No.: 17/895,897

(22) Filed: Aug. 25, 2022

(65) Prior Publication Data

US 2024/0072823 A1 Feb. 29, 2024

(51) Int. Cl.
*H03M 3/00* (2006.01)
*H03F 3/217* (2006.01)
(52) U.S. Cl.
CPC ............. *H03M 3/38* (2013.01); *H03M 3/344* (2013.01); *H03M 3/458* (2013.01); *H03F 3/217* (2013.01)
(58) Field of Classification Search
CPC ........ H03M 3/38; H03M 3/344; H03M 3/458; H03F 3/217
See application file for complete search history.

(56) References Cited

U.S. PATENT DOCUMENTS 9,379,676 B2 * 6/2016 Johnson .................... H03F 1/56
2010/0201551 A1 8/2010 Sebastiano et al.
2015/0214911 A1 7/2015 Johnson et al.

FOREIGN PATENT DOCUMENTS

CN 111628777 A 9/2020

OTHER PUBLICATIONS

Combined Search and Examination Report under Sections 17 and 18(3), UKIPO, Application No. GB2309448.5, mailed Dec. 18, 2023.

* cited by examiner

*Primary Examiner* — Joseph J Lauture
(74) *Attorney, Agent, or Firm* — Jackson Walker L.L.P.

(57) ABSTRACT

In accordance with embodiments of the present disclosure, a method may include, in a system comprising a differential filter comprising a plurality of impedance elements, applying a common-mode signal to the differential filter, measuring an output signal of the differential filter in response to the common-mode signal to determine an error due to impedance mismatch of the impedance elements, and tuning one or more of the plurality of impedance elements to minimize the error.

16 Claims, 4 Drawing Sheets

… (1)

CALIBRATION OF ANTI-ALIASING FILTER MISMATCH

FIELD OF DISCLOSURE

The present disclosure relates in general to methods and systems for calibrating for impedance mismatches in an anti-aliasing filter.

BACKGROUND

Delta-sigma modulators are typically used in electronic circuits such as analog-to-digital converters (ADCs). Often, such ADCs employ an anti-aliasing filter to filter an analog input signal that may be sampled by a sampling network at the input of the delta-sigma modulator for conversion into an equivalent digital signal by the ADC. An example of such a sampling network is a switched capacitor circuit.

FIG. 1 illustrates an example system 100 including a differential input ADC 104 with an anti-aliasing filter 102 at its input, as is known in the art. In ideal operation, anti-aliasing filter 102 may low-pass filter an analog differential input signal $V_{Diff}$ and ADC 104 may sample such filtered analog differential signal at a sampling frequency $f_s$ and convert such filtered analog differential signal to an equivalent digital signal DIGOUT. However, a mismatch $\Delta R$ between resistances R of anti-aliasing filter 102 and/or a mismatch $\Delta C$ between capacitances C of anti-aliasing filter 102 may lead to non-ideal operating, including conversion of alternating current (AC) components of a common-mode voltage VCM to the output of ADC 104. The magnitude of common-mode to differential conversion may increase with frequency from direct current (DC) up to the corner frequency of anti-aliasing filter 102. Accordingly, systems and methods for reducing or eliminating the effects of such mismatch may be desirable.

SUMMARY

In accordance with the teachings of the present disclosure, the disadvantages and problems associated with impedance mismatches in an anti-aliasing filter may be reduced or eliminated.

In accordance with embodiments of the present disclosure, a method may include, in a system comprising a differential filter comprising a plurality of impedance elements, applying a common-mode signal to the differential filter, measuring an output signal of the differential filter in response to the common-mode signal to determine an error due to impedance mismatch of the impedance elements, and tuning one or more of the plurality of impedance elements to minimize the error.

In accordance with these and other embodiments of the present disclosure, a system may include a signal generator configured to apply a common-mode signal to a differential filter comprising a plurality of impedance elements, an error extractor configured to measure an output signal of the differential filter in response to the common-mode signal to determine an error due to impedance mismatch of the impedance elements, and a controller configured to tune one or more of the plurality of impedance elements to minimize the error.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Figure 1:
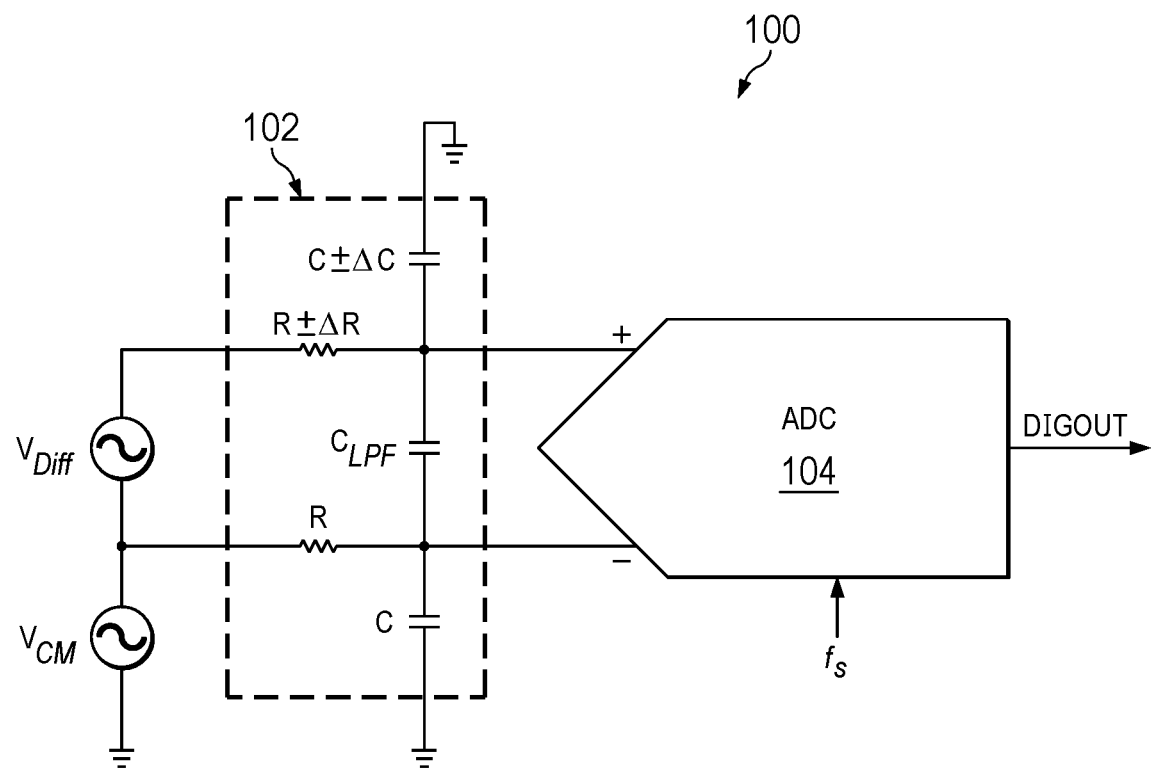
FIG. 1 illustrates an example system including a differential input ADC with an anti-aliasing filter at its input, as is known in the art.
Figure 2:
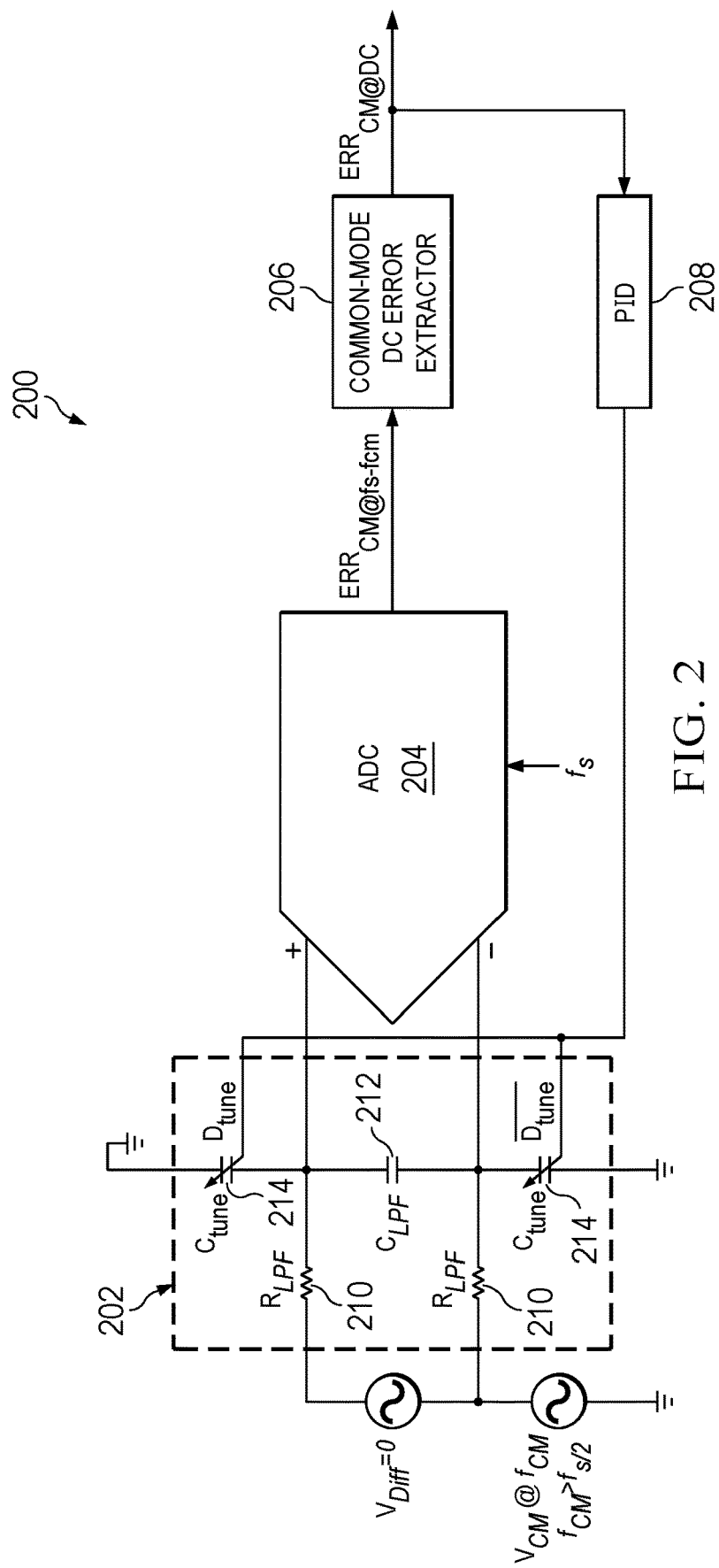
FIG. 2 illustrates an example system including a differential input ADC having an anti-aliasing filter at its input, with calibration circuitry for compensating for impedance mismatch within the anti-aliasing filter, in accordance with embodiments of the present disclosure.

FIG. 2 illustrates an example system 200 including a differential input ADC 204 having an anti-aliasing filter 202 at its input, with calibration circuitry comprising a common-mode DC error extractor 206 and proportional-integral-differential (PID) controller 208 for compensating for impedance mismatch within anti-aliasing filter 202, in accordance with embodiments of the present disclosure.

Anti-aliasing filter 202 may comprise any suitable system, device, or apparatus, for receiving an analog input signal, for example in the form of a differential voltage $V_{Diff}$ and low-pass filtering the analog input signal. FIG. 2 depicts application of $V_{Diff}=0$ during a calibration phase of system 200, but during normal operation of system 200, differential voltage $V_{Diff}$ may comprise any suitable signal.

As shown in FIG. 2, anti-aliasing filter 202 may comprise resistors 210, each resistor 210 coupled between a respective input and a respective output of anti-aliasing filter 202. In addition, anti-aliasing filter 202 may include a capacitor 212 coupled between the outputs of anti-aliasing filter 202. Further, anti-aliasing filter 202 may include tunable capacitors 214, each tunable capacitor 214 coupled between a respective output of anti-aliasing filter 202 and ground. As shown in FIG. 2, a capacitance $C_{tune}$ of one or both tunable capacitors 214 may be controlled by a digital control signal $D_{tune}$ generated by PID controller 208, as described in greater detail below. Further, although for the purposes of clarity and exposition resistors 210 are shown in FIG. 2 as having fixed resistances $R_{LPF}$, in some embodiments, one or both of resistors 210 may have tunable resistances controlled by digital control signal $D_{tune}$ or another control signal generated by PID controller 208.

Although FIG. 2 depicts anti-aliasing filter 202 as a first-order filter for purposes of clarity and exposition, in some embodiments, anti-aliasing filter 202 may be a second-order or higher-order filter.

ADC 204 may comprise any suitable system, device, or apparatus configured to sample the filtered analog signal generated at a sampling frequency $f_s$ and generate a digital signal equivalent to such filtered analog signal.

Common-mode DC error extractor 206 and PID controller 208 may only be active during a calibration mode of system 200. In operation during the calibration mode, calibration control circuitry (not shown for purposes of clarity and exposition) may apply a differential voltage $V_{diff}=0$ across input terminals of anti-aliasing filter 202 (e.g., by shorting the input terminals together via a switch) and apply a known common-mode signal $V_{CM}$ to the input terminals. As shown in FIG. 2, such known common-mode signal $V_{CM}$ may be a periodic signal (e.g., a square wave, sine wave, triangular wave, other periodic signal) at a given frequency $f_{CM}$ or combination of frequencies outside of the Nyquist band of ADC 204 (e.g., greater than one-half of sampling frequency or $0.5f_s$).

As a result of application of known common-mode signal $V_{CM}$ during the calibration phase, and as a result of mismatches of impedances of anti-aliasing filter 202, ADC 204 may generate a common-mode error signal $ERR_{CM@fs\text{-}fCM}$ at a frequency $f_s\text{-}f_{CM}$. Common-mode DC error extractor 206 may comprise any suitable system, device, or apparatus configured to receive common-mode error signal $ERR_{CM@fs\text{-}fCM}$ and generate a common-mode DC error $ERR_{CM@DC}$ from common-mode error signal $ERR_{CM@fs\text{-}fCM}$. For example, in some embodiments, common-mode DC error extractor 206 may comprise a peak detector.

Figure 3:
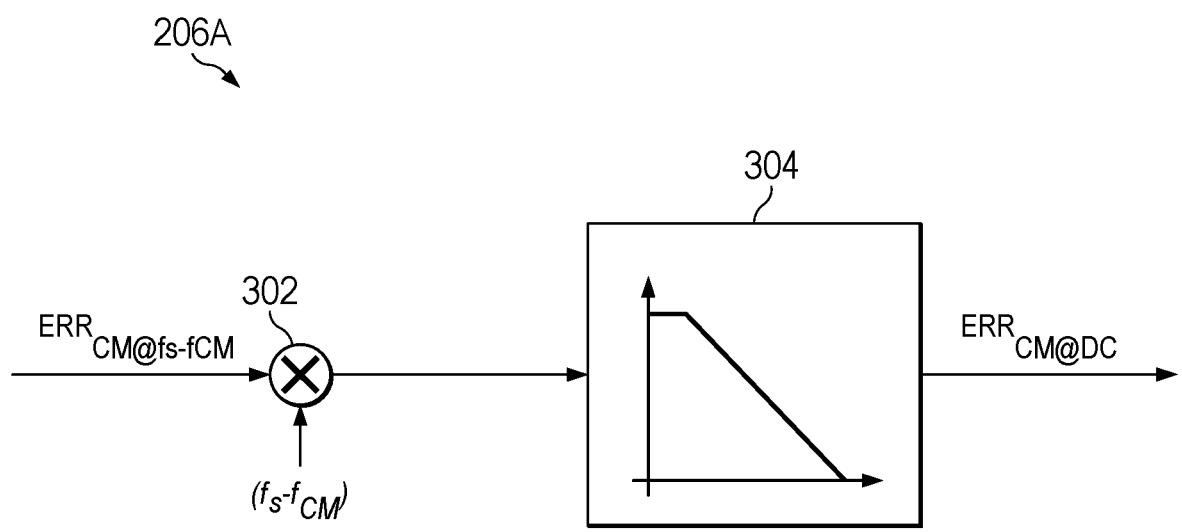
FIG. 3 illustrates an example coherent demodulation backend for measuring common-mode error, in accordance with embodiments of the present disclosure.

As another example, in some embodiments, common-mode DC error extractor 206 may comprise a coherent demodulation backend, as shown in FIG. 3, to obtain proper phase and frequency alignment with respect to the applied known common-mode signal $V_{CM}$. The input common-mode frequency $f_{CM}$ may be within the Nyquist band and demodulated at the same frequency as known common-mode signal $V_{CM}$, or demodulated above the Nyquist frequency wherein image is demodulated with the difference $f_s\text{-}f_{CM}$. FIG. 3 illustrates an example coherent modulation backend 206A for measuring common-mode error, in accordance with embodiments of the present disclosure. In some embodiments, coherent modulation backend 206A may be used to implement all or part of common-mode DC error extractor 206. As shown in FIG. 3, coherent modulation backend 206A may include a demodulator 302 configured to demodulate common-mode error signal $ERR_{CM@fs\text{-}fcm}$ at frequency $f_s\text{-}f_{cm}$ and a low-pass digital filter 304 configured to low-pass filter the resulting demodulated signal to generate common-mode DC error $ERR_{CM@DC}$. Although FIG. 3 depicts demodulation by coherent modulation backend 206A at a particular frequency, coherent modulation backend 206A may perform demodulation at any suitable frequency. For example, in some embodiments, coherent modulation backend 206A may perform coherent demodulation of common-mode frequency $f_{CM}$ with common-mode frequency $f_{CM}$ for $f_{CM}<0.5f_s$.

Turning again to FIG. 2, PID controller 208 may be any suitable feedback controller that continuously applies a correction in the form of control signals $D_{tune}$ that tune one or both capacitances $C_{tune}$ of tunable capacitors 214, based on common-mode DC error $ERR_{CM@DC}$ and based on proportional, integral, and/or derivative terms, in order to minimize common-mode DC error $ERR_{CM@DC}$.

Although, as mentioned above, FIG. 2 depicts control signals $D_{tune}$ for tuning capacitances $C_{tune}$ of tunable capacitors 214, in some embodiments, PID controller 208 may also generate control signals for tuning resistances $R_{LPF}$ of resistors 210. For example, in some embodiments, during a first portion of a calibration phase, known common-mode signal $V_{CM}$ at DC or at a frequency $f_{CM}$ significantly lower than the corner frequency of anti-aliasing filter 202 may be applied to the inputs of anti-aliasing filter 202, and PID controller 208 may tune resistances 210 in response to the DC/lower-frequency error signal generated by the DC/lower-frequency known common-mode signal $V_{CM}$ in order to minimize such DC/lower-frequency error. In a second portion of the calibration phase, a significantly higher-frequency alternating current known common-mode signal $V_{CM}$ may be applied to the inputs of anti-aliasing filter 202, and PID controller 208 may tune tunable capacitances 214 (and in some embodiments, resistors 210) in response to the higher-frequency error signal generated by the higher-frequency known common-mode signal $V_{CM}$ in order to minimize such higher-frequency error.

Figure 4:
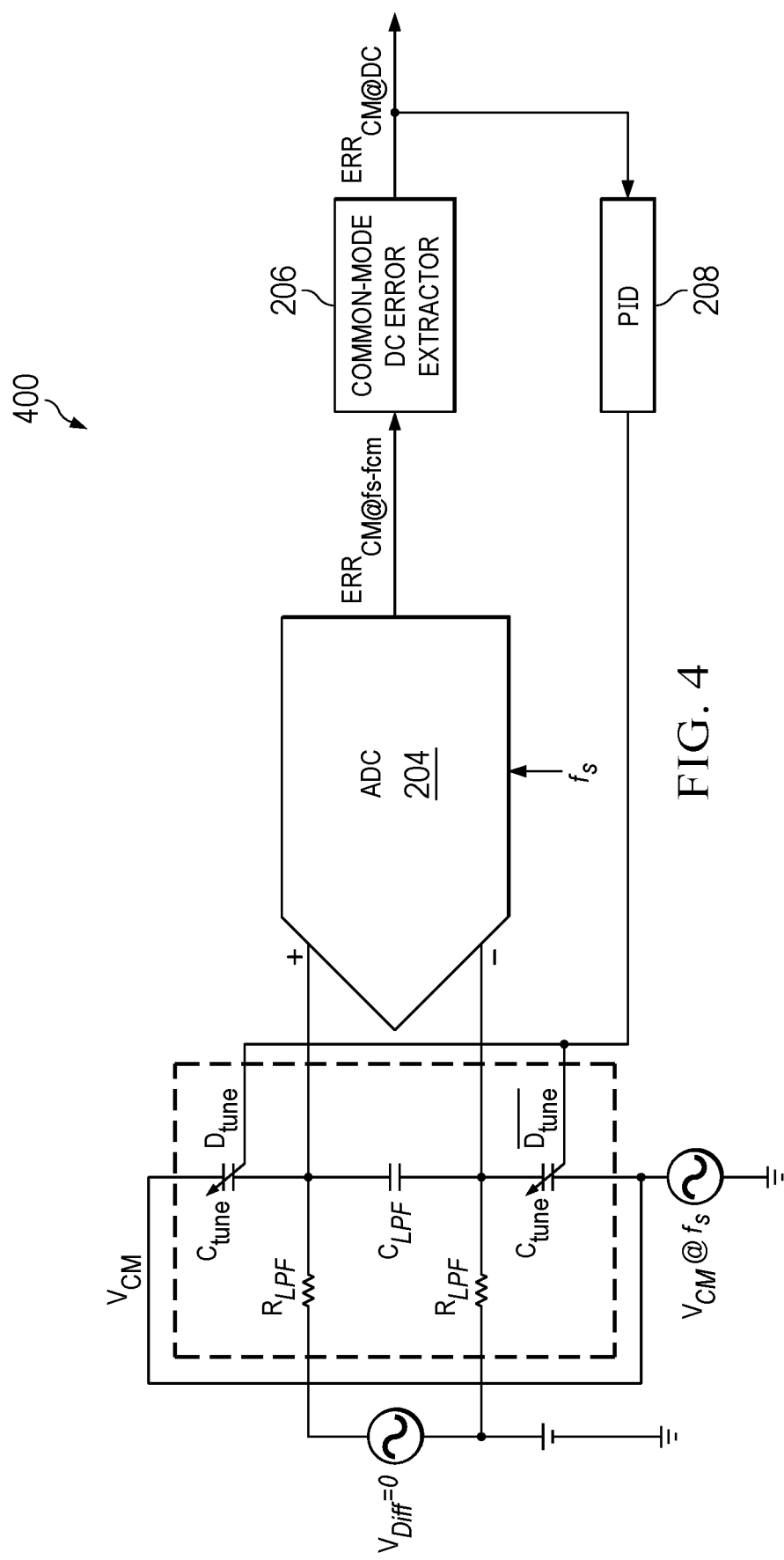
FIG. 4 illustrates another example system including a differential input ADC having an anti-aliasing filter at its input, with calibration circuitry for compensating for impedance mismatch within the anti-aliasing filter, in accordance with embodiments of the present disclosure.

FIG. 4 illustrates another example system 400 including a differential input ADC 204 having an anti-aliasing filter 202 at its input, with calibration circuitry for compensating for impedance mismatch within anti-aliasing filter 202, in accordance with embodiments of the present disclosure. Example system 400 shown in FIG. 4 may be similar in many respects to example system 200 shown in FIG. 2, except that in system 400, rather than applying known common-mode signal $V_{CM}$ to the inputs of anti-aliasing filter 202 during the calibration phase, known common-mode signal $V_{CM}$ may be applied to the ground terminals of tunable capacitors 214 at sampling frequency $f_s$.

In some embodiments, a one-time calibration (e.g., during startup of a device comprising system 200 or system 400) may be sufficient for the entirety of normal operation of system 200 or system 400, especially if mismatch ratios of the impedances of anti-aliasing filter 202 can reasonably be expected to remain the same. In such case, control signals $D_t$ne generated by PID controller 208 may be stored (e.g., in a digital register or other memory) for the duration of normal operation and common-mode DC error extractor 206 and/or PID controller 208 may be disabled to minimize power consumption. However, in other embodiments, in-situ in-run calibration may be continuously performed during operating of system 200 and/or system 400.

Although the foregoing contemplates measurement of mismatch error and generation of control signals for compensating mismatch error in the digital domain, in some embodiments, mismatch error in response to known common-mode signal $V_{CM}$ may be measured in the analog domain based on outputs of anti-aliasing filter 202, in which case common-mode DC error extractor 206 and PID controller 208 as depicted in FIGS. 2 and 4 may be replaced with analog equivalent circuits in order to generate control signals for compensating impedance mismatch of anti-aliasing filter 202.

In systems 200 and 400, tunable capacitors 214 are shown as being controlled by control signals $D_{tune}$ and $\overline{D_{tune}}$. In alternative implementations, PID controller 208 may control tunable capacitors 214 with separate control signals provided as separate outputs from PID controller 208 which are not inverse of one another.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method comprising, in a system comprising a differential filter comprising a plurality of impedance elements:
    applying a common-mode signal to the differential filter;
    measuring an output signal of the differential filter in response to the common-mode signal to determine an error due to impedance mismatch of the impedance elements; and
    tuning one or more of the plurality of impedance elements to minimize the error.

2. The method of claim 1, wherein applying the common-mode signal to the differential filter comprises applying the common-mode signal to inputs of the differential filter.

3. The method of claim 1, wherein applying the common-mode signal to the differential filter comprises applying the common-mode signal to common-mode ground nodes of capacitors of the differential filter.

4. The method of claim 1, wherein tuning one or more of the plurality of impedance elements comprises tuning one or more capacitances of the differential filter.

5. The method of claim 1, wherein tuning one or more of the plurality of impedance elements comprises tuning one or more resistances of the differential filter.

6. The method of claim 1, wherein the common-mode signal is greater than one-half of a sampling frequency of an analog-to-digital converter that receives the output signal of the differential filter.

7. The method of claim 1, wherein tuning comprises using a closed-loop controller to tune the one or more of the plurality of impedance elements responsive to the error.

8. The method of claim 1, wherein measuring an output of the differential filter comprises:
    converting the output signal to a digital equivalent signal; and
    tuning one or more of the plurality of impedance elements to minimize the digital equivalent signal.

9. A system comprising:
    a signal generator configured to apply a common-mode signal to a differential filter comprising a plurality of impedance elements;
    an error extractor configured to measure an output signal of the differential filter in response to the common-mode signal to determine an error due to impedance mismatch of the impedance elements; and
    a controller configured to tune one or more of the plurality of impedance elements to minimize the error.

10. The system of claim 9, wherein applying the common-mode signal to the differential filter comprises applying the common-mode signal to inputs of the differential filter.

11. The system of claim 9, wherein applying the common-mode signal to the differential filter comprises applying the common-mode signal to common-mode ground nodes of capacitors of the differential filter.

12. The system of claim 9, wherein tuning one or more of the plurality of impedance elements comprises tuning one or more capacitances of the differential filter.

13. The system of claim 9, wherein tuning one or more of the plurality of impedance elements comprises tuning one or more resistances of the differential filter.

14. The system of claim 9, wherein the common-mode signal is greater than one-half of a sampling frequency of an analog-to-digital converter that receives the output signal of the differential filter.

15. The system of claim 9, wherein tuning comprises using a closed-loop controller to tune the one or more of the plurality of impedance elements responsive to the error.

16. The system of claim 9, wherein measuring an output of the differential filter comprises:
 converting the output signal to a digital equivalent signal; and
 tuning one or more of the plurality of impedance elements to minimize the digital equivalent signal.

\* \* \* \* \*